(12) United States Patent
Dunga et al.

(10) Patent No.: US 7,755,946 B2
(45) Date of Patent: Jul. 13, 2010

(54) DATA STATE-BASED TEMPERATURE COMPENSATION DURING SENSING IN NON-VOLATILE MEMORY

(75) Inventors: Mohan V. Dunga, Santa Clara, CA (US); Masaaki Higashitani, Cupertino, CA (US)

(73) Assignee: Sandisk Corporation, Milpitas, CA (US)

( * ) Notice: Subject to any disclaimer, the term of this patent is extended or adjusted under 35 U.S.C. 154(b) by 137 days.

(21) Appl. No.: 12/233,950

(22) Filed: Sep. 19, 2008

(65) Prior Publication Data

US 2010/0074014 A1    Mar. 25, 2010

(51) Int. Cl.
*G11C 16/00* (2006.01)

(52) U.S. Cl. .................. 365/185.17; 365/185.03; 365/185.22; 365/211

(58) Field of Classification Search .......... 365/211
See application file for complete search history.

(56) References Cited

U.S. PATENT DOCUMENTS

| | | | |
|---|---|---|---|
| 5,172,338 A | 12/1992 | Mehrotra et al. | |
| 5,422,842 A * | 6/1995 | Cernea et al. | 365/185.22 |
| 5,684,739 A | 11/1997 | Takeuchi | |
| 5,764,572 A * | 6/1998 | Hammick | 365/189.15 |
| 5,864,504 A | 1/1999 | Tanzawa et al. | |
| 5,898,617 A * | 4/1999 | Bushey et al. | 365/185.2 |
| 5,912,838 A | 6/1999 | Chevallier | |
| 6,205,074 B1 | 3/2001 | Van Buskirk et al. | |
| 6,227,762 B1 | 5/2001 | Van Velsor | |
| 6,331,960 B1 | 12/2001 | Miyamoto | |
| 6,349,060 B1 | 2/2002 | Ogura | |
| 6,452,437 B1 | 9/2002 | Takeuchi et al. | |
| 6,462,998 B1 | 10/2002 | Proebsting | |
| 6,560,152 B1 | 5/2003 | Cernea | |
| 6,728,141 B2 | 4/2004 | Micheloni et al. | |
| 6,801,454 B2 | 10/2004 | Wang et al. | |
| 6,859,397 B2 | 2/2005 | Lutze et al. | |
| 6,870,766 B2 | 3/2005 | Cho et al. | |
| 6,917,542 B2 | 7/2005 | Chen et al. | |
| 7,027,944 B2 | 4/2006 | Tabaian et al. | |
| 7,057,958 B2 | 6/2006 | So et al. | |
| 7,120,051 B2 | 10/2006 | Gorobets et al. | |
| 7,190,621 B2 | 3/2007 | Redaelli et al. | |

(Continued)

OTHER PUBLICATIONS

International Search Report & The Written Opinion of the International Searching Authority dated Feb. 3, 2010 in International Application No. PCT/US2009/056405 filed Sep. 9, 2009.

*Primary Examiner*—Tan T. Nguyen
(74) *Attorney, Agent, or Firm*—Vierra Magen Marcus & DeNiro LLP

(57) ABSTRACT

Temperature effects in a non-volatile storage device are addressed by providing a data state-dependent, and optionally temperature dependent, sense current during verify and read operations. A different sense current is provided for each data state, so that a common temperature coefficient is realized for storage elements with different data states. The temperature coefficient for higher states can be reduced to that of lower states. During sensing, a sense time can be adjusted to achieve a desired sense current when a selected storage element is in a conductive state. A fixed voltage trip point may be maintained. During the sense time, a pre-charged capacitor discharges into a selected storage element such as via a bit line and NAND string, when the selected storage element is in a conductive state. The discharge level is translated to a current which is compared to a state-dependent, and optionally temperature dependent, reference current.

19 Claims, 14 Drawing Sheets

U.S. PATENT DOCUMENTS

| | | |
|---|---|---|
| 7,237,074 B2 | 6/2007 | Guterman et al. |
| 7,277,343 B1 | 10/2007 | So et al. |
| 7,277,355 B2 | 10/2007 | Tanzawa |
| 7,304,466 B1 | 12/2007 | Kimura |
| 7,376,030 B2 | 5/2008 | Cernea |
| 7,447,079 B2 * | 11/2008 | Nguyen et al. ......... 365/185.21 |
| 2002/0109539 A1 | 8/2002 | Takeuchi et al. |
| 2005/0036369 A1 | 2/2005 | Lee et al. |
| 2006/0140007 A1 | 6/2006 | Cernea |
| 2006/0285408 A1 | 12/2006 | Betser et al. |
| 2007/0291567 A1 | 12/2007 | Mokhlesi et al. |
| 2008/0013382 A1 | 1/2008 | Tang |

\* cited by examiner

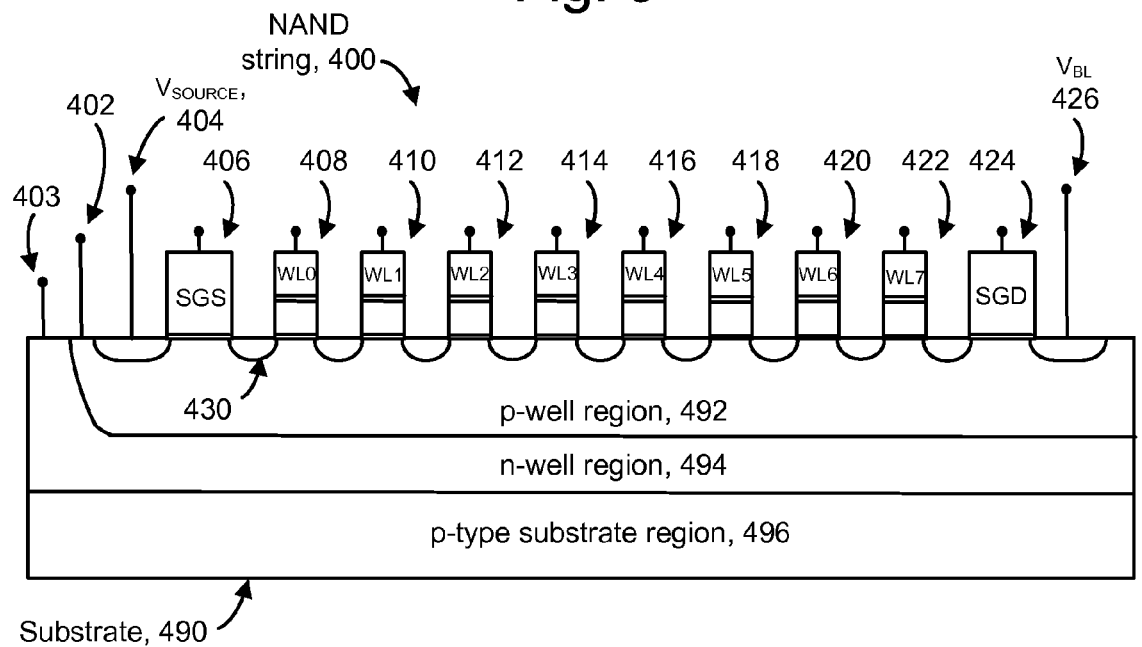
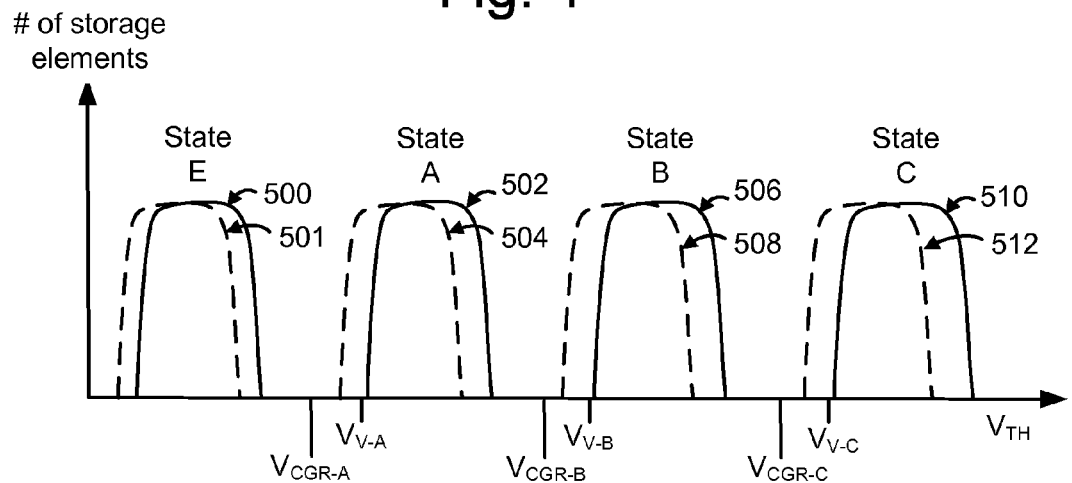

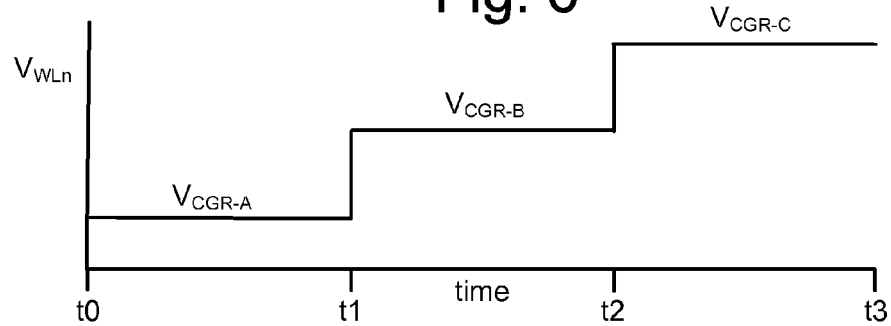
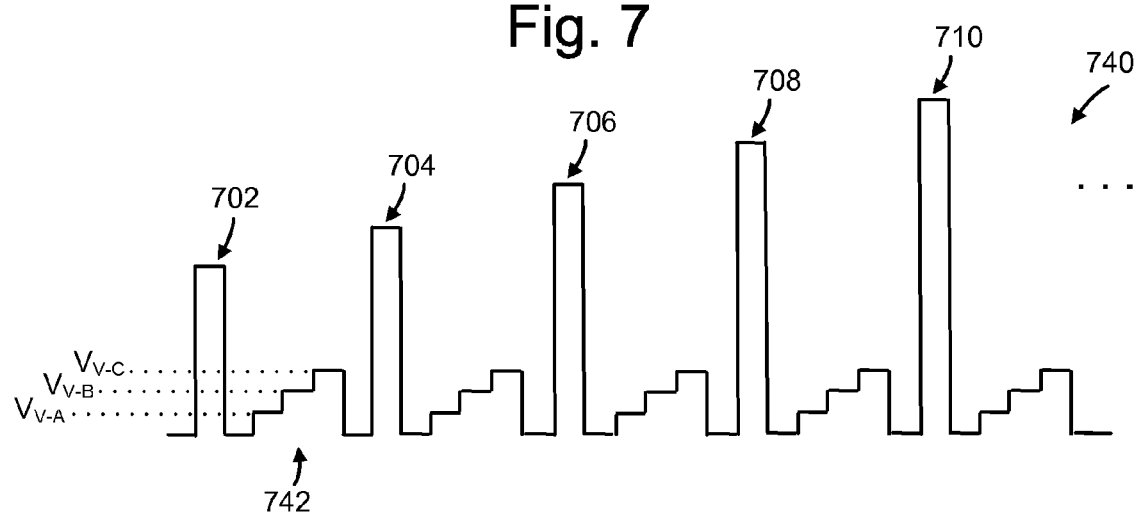

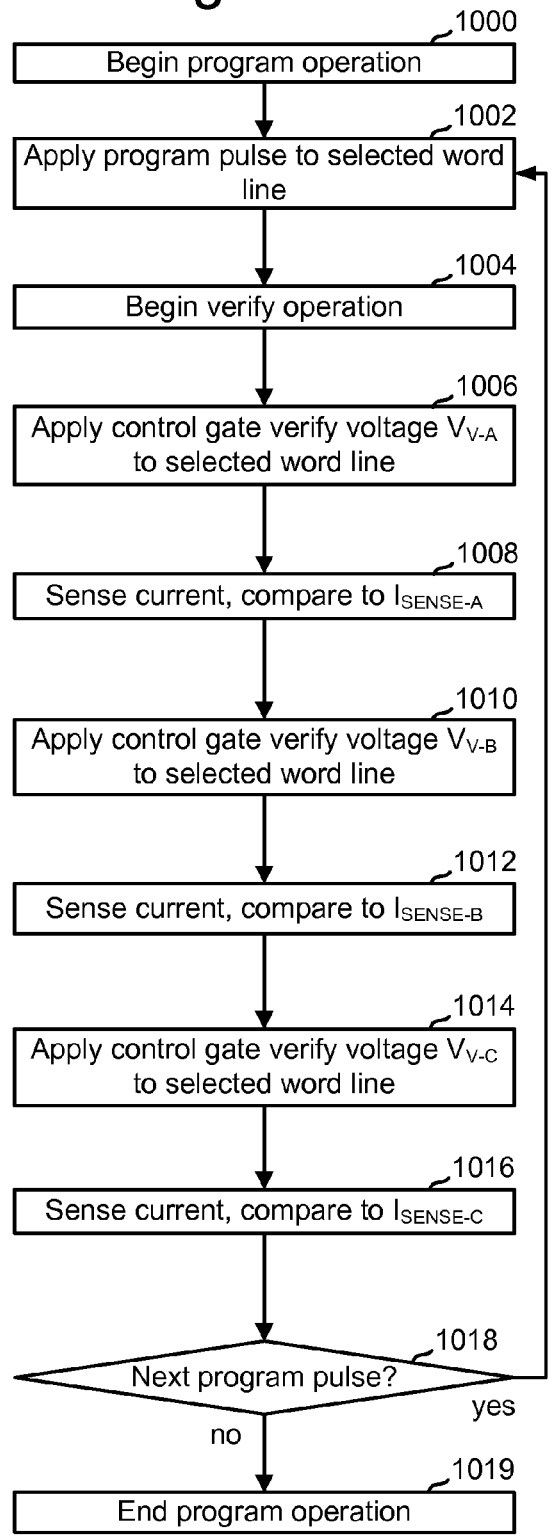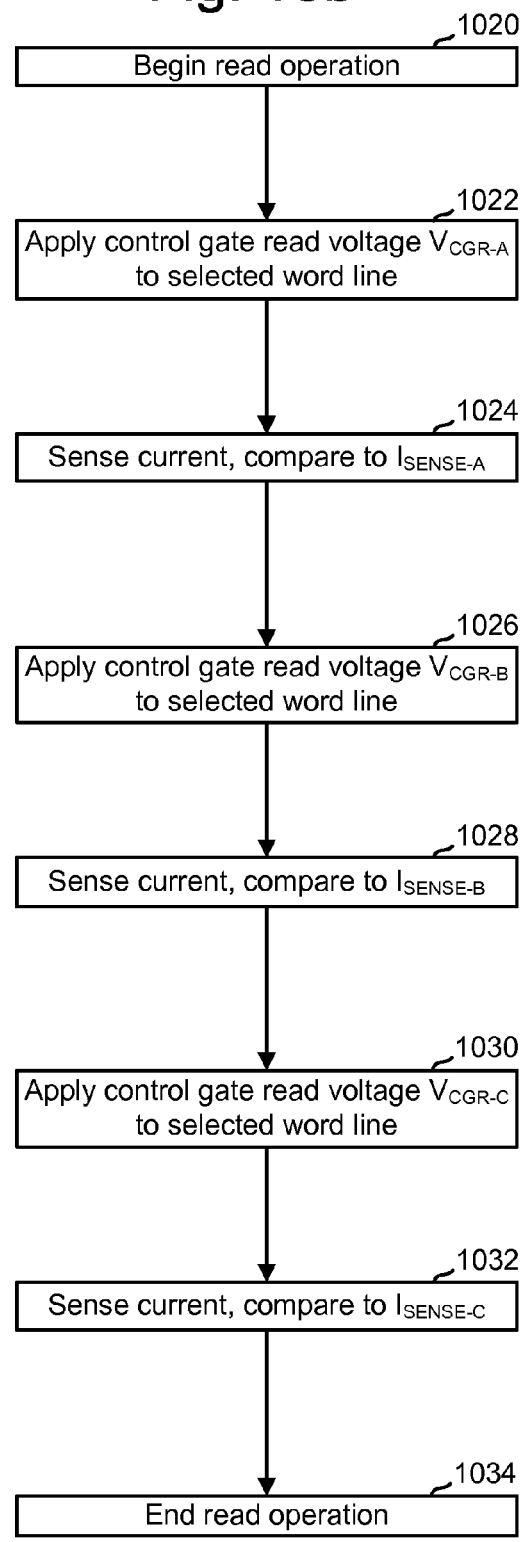

DATA STATE-BASED TEMPERATURE COMPENSATION DURING SENSING IN NON-VOLATILE MEMORY

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. Nos. 6,859,397 and 6,917,542, both of which are incorporated herein by reference.

In present non-volatile storage devices, such as NAND flash memory devices, temperature variations present issues in reading and writing data. A memory device is subject to varying temperatures based on the environment in which it is located. For example, some current memory devices are rated for use between −40° C. and +85° C. Devices in industrial, military and consumer applications may experience significant temperature variations. Temperature affects many transistor parameters, the dominant among which is the threshold voltage. In particular, temperature variations can cause read errors and widen the threshold voltage distributions of the different states of a non-volatile storage element. Improved techniques are needed for addressing inaccuracies which result from changes in temperature.

SUMMARY OF THE INVENTION

The present invention addresses the above and other issues by providing a method for improving read accuracy in non-volatile storage by inducing a data state-dependent current in the storage elements during verify and read operations.

In one embodiment, a method for operating non-volatile storage includes: (a) applying voltages, one at a time, to a control gate of a selected non-volatile storage element, (b) while applying each voltage, coupling, to the selected non-volatile storage element, at least one current source, (c) sensing a current which flows through the selected non-volatile storage element, and (d) comparing the sensed current to a reference current which is different for at least two of the voltages. Different sense currents can be used for different voltages, e.g., of different states.

In another embodiment, a method for operating non-volatile storage includes: (a) applying a voltage to a control gate of at least one selected non-volatile storage element in a NAND string via a selected word line, the voltage separates lower and higher states, (b) if the at least one selected non-volatile storage element is made conductive by the applying the voltage, inducing a current through the selected non-volatile storage element, and (c) comparing the current to a reference current which is based on a reference temperature coefficient of the higher state. The reference current can differ for different states, at the same reference temperature coefficient.

In another embodiment, the sense current can depend on both the states and the temperature coefficient.

In another embodiment, a method for operating non-volatile storage includes: (a) applying voltages, one at a time, to a control gate of a selected non-volatile storage element, (b) while applying each voltage, coupling, to the selected non-volatile storage element, a pre-charged capacitor, the capacitor discharges into the selected non-volatile storage element when the selected non-volatile storage element is in a conductive state, and (c) after a discharge time which differs for each of the voltages, determining whether the selected non-volatile storage element is in the conductive state based on whether the capacitor has discharged below a trip point. The discharge time may also change with temperature.

In another embodiment, a non-volatile storage includes a set of non-volatile storage element and at least one control circuit. The at least one control circuit applies voltages, one at a time, to a control gate of a selected non-volatile storage element, while applying each voltage, couples, to the selected non-volatile storage element, at least one current source, senses a current which flows through the selected non-volatile storage element, and compares the sensed current to a reference current which is different for at least two of the voltages.

Corresponding methods, systems and computer- or processor-readable storage devices for performing the methods provided herein may also be provided.

BRIEF DESCRIPTION OF THE DRAWINGS

FIG. 1b is an equivalent circuit diagram of the NAND string of FIG. 1a.

FIG. 3 depicts a cross-sectional view of a NAND string.

FIG. 4 depicts a threshold voltage distribution.

FIG. 6 depicts control gate read voltages applied to a selected word line during a read operation.

FIG. 7 depicts an example pulse train applied to the control gates of selected non-volatile storage elements during programming.

FIG. 10a depicts a program-verify process.

FIG. 10b depicts a read process.

DETAILED DESCRIPTION

The present invention provides a method for improving read accuracy in non-volatile storage by inducing a data state-dependent current in the storage elements during verify and read operations.

Figure 1A:
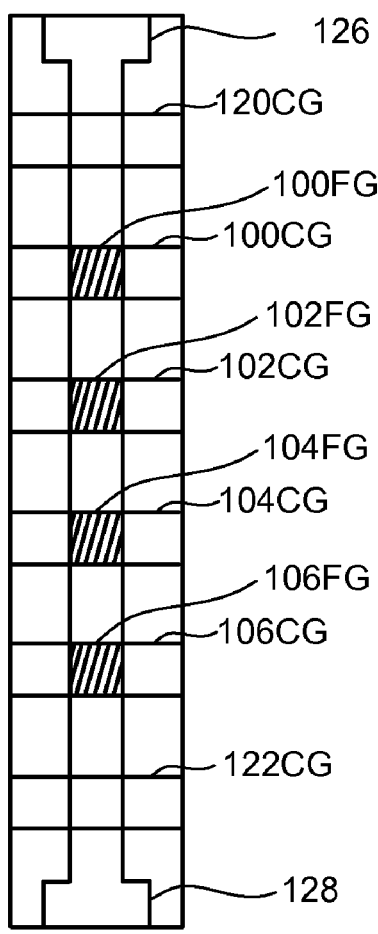
FIG. 1a is a top view of a NAND string.
Figure 1B:
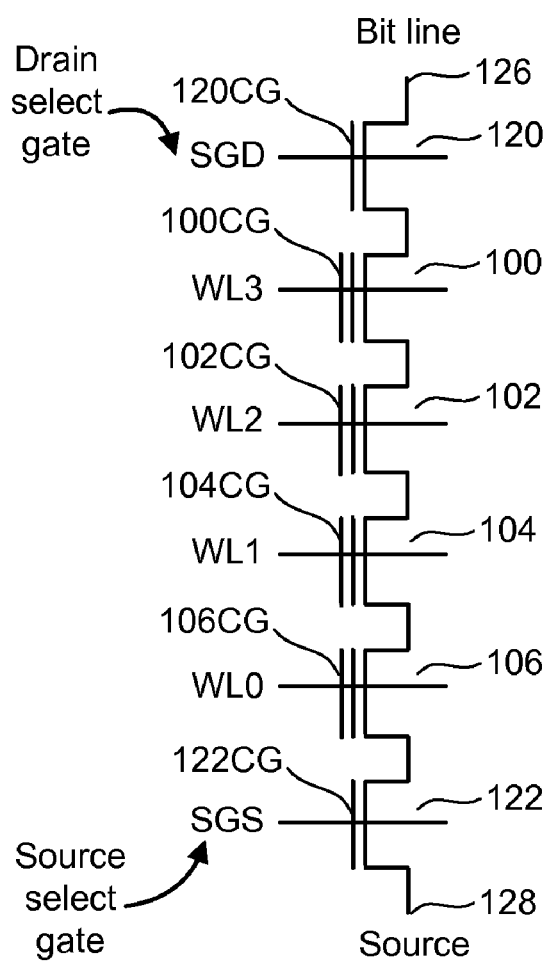

One example of a memory system suitable for implementing the present invention uses the NAND flash memory structure, which includes arranging multiple transistors in series between two select gates. The transistors connected in series and the select gates are referred to as a NAND string. FIG. 1a is a top view showing one NAND string. FIG. 1b is an equivalent circuit thereof. The NAND string depicted includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted. Select gate 120 is connected to select line SGD. Select gate 122 is connected to select line SGS.

Figure 2:
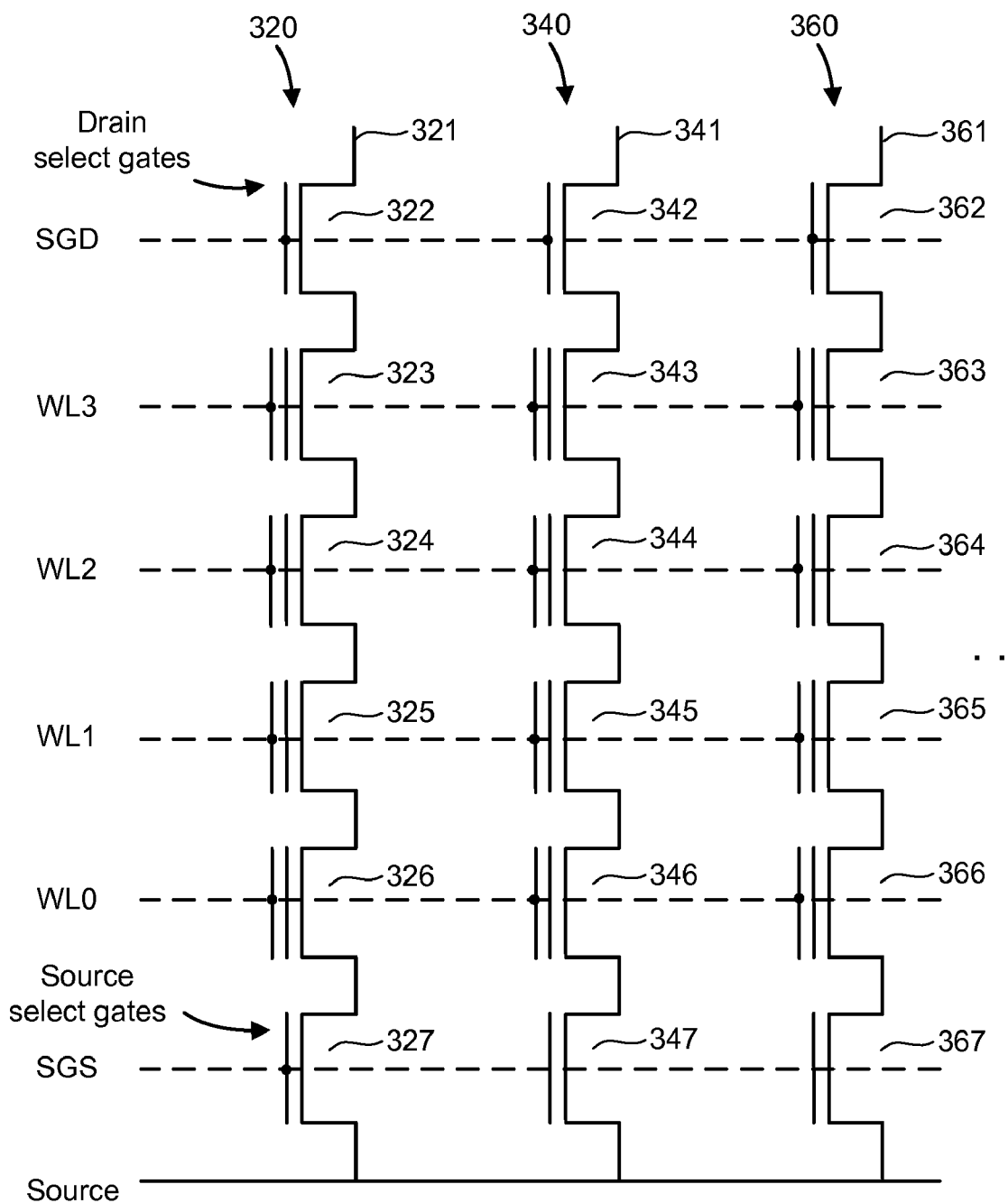
FIG. 2 is a block diagram of an array of NAND flash storage elements.

FIG. 2 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements.

Relevant examples of NAND type flash memories and their operation are provided in U.S. Pat. Nos. 5,386,422, 5,570,315, 5,774,397, 6,046,935, 6,456,528 and 6,522,580, each of which is incorporated herein by reference.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324, the program voltage will also be applied to the control gates of storage elements 344 and 364.

FIG. 3 depicts a cross-sectional view of a NAND string. The view is simplified and not to scale. The NAND string 400 includes a source-side select gate 406, a drain-side select gate 424, and eight storage elements 408, 410, 412, 414, 416, 418, 420 and 422, formed on a substrate 490. The components can be formed on a p-well region 492 which itself is formed in an n-well region 494 of the substrate. The n-well can in turn be formed in a p-substrate 496. Supply lines 402 and 403 may communicate with the p-well region 492 and n-well region 494, respectively. A source supply line 404 with a potential of $V_{SOURCE}$ is provided in addition to a bit line 426 with a potential of $V_{BL}$. $V_{SGS}$ is applied to the select gate 406 and $V_{SGD}$ is applied to the select gate 424. The source side of a word line or non-volatile storage element refers to the side which faces the source end of the NAND string, e.g., at source supply line 404, while the drain side of a word line or non-volatile storage element refers to the side which faces the drain end of the NAND string, e.g., at bit line 426.

FIG. 4 depicts a threshold voltage ($V_{TH}$) distribution. Generally, a set of multi-level storage elements can be programmed to $2^N$ different states, where $N \geq 2$. For example, four, eight or sixteen states can be used. However, as the number of states increases and the spacing between states decreases, it is increasingly important to be able to accurately read back the programmed data state of each storage element. As mentioned at the outset, one factor which affects read accuracy is temperature, which can vary between the time the storage elements are programmed and read. Reading at a lower temperature than programming results in the $V_{TH}$ shifting higher. Similarly, reading at a higher temperature than programming results in the $V_{TH}$ shifting lower. For example, distributions 500, 502, 506 and 510 depict the E (erased), A, B and C states, respectively. Shifting of the $V_{TH}$ downward is depicted by threshold distributions 501, 504, 508 and 512 for the E, A, B and C states, respectively.

Figure 5A:
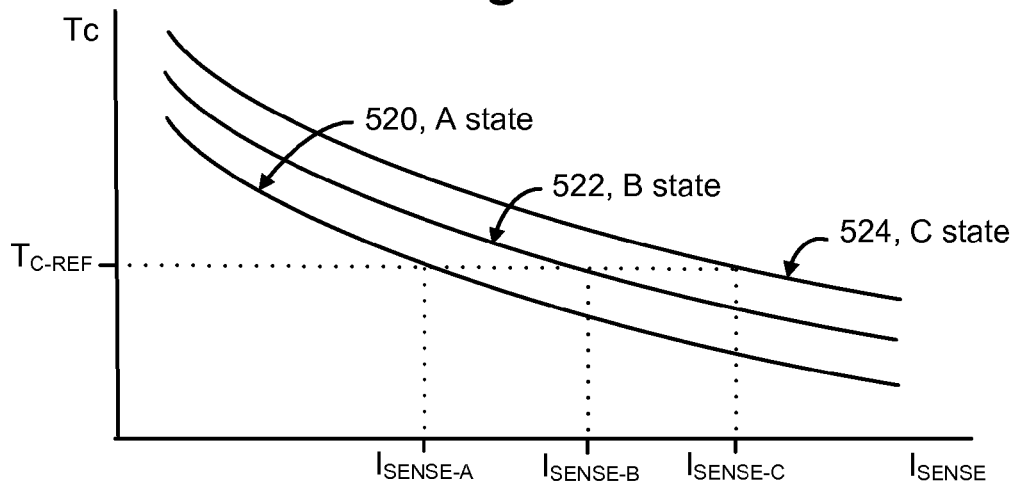
FIG. 5a depicts a temperature coefficient versus sense current relationship for different states.

The control gate verify voltages $V_{V-A}$, $V_{V-B}$ and $V_{V-C}$ for states A, B and C, respectively, are used during the verify portion of a program-verify operation to verify whether one or more selected storage elements have been programmed to an intended state. Similarly, the control gate read voltages $V_{CGR-A}$, $V_{CGR-B}$ and $V_{CGR-C}$ for states A, B and C, respectively, are used during a read operation to ascertain the data state of one or more selected storage elements. The threshold voltages can shift due to temperature and other effects to an extent which results in read errors. One approach to addressing temperature variations involves adjusting the control gate read voltages based on temperature. For example, if the $V_{TH}$ is raised, the control gate read voltage can be raised accordingly. However, while this approach can compensate for temperature variations, it does not reduce or eliminate such variations at the level of the storage element FIG. 5a depicts a temperature coefficient (Tc) versus sense current (Isense) relationship for different data states. Tc represents the change in $V_{TH}$ versus temperature. The temperature coefficient (Tc) depends on various characteristics of the memory device, such as doping, layout and so forth. Moreover, the temperature coefficient is expected to increase in magnitude as memory dimensions are reduced. Generally, the Tc can be measured for a specific memory device through testing at different temperatures.

In non-volatile storage such as a multi-level NAND or NOR, the temperature coefficient Tc is state dependent. For example, curves 520, 522 and 524 depict the magnitude of Tc for different sense currents for states A, B and C, respectively. The absolute value of Tc is depicted. Tc, which is defined as Tc=$\Delta V_{TH}/\Delta$Temp, typically has a negative value since $V_{TH}$ decreases as temperature increases. Tc can have a range of about −1 mV/° C. to −4 mV/° C., for instance. Moreover, as storage elements become smaller, the Tc and its state dependency becomes stronger. One approach to addressing temperature effects, described herein, involves changing the sense current level as a function of the data state.

The $V_{TH}$ of a storage element depends on the sense current level which is used during sensing, including verify and read operations. The higher the sense current level, the lower the floating gate charge needed to reach a certain programmed state. Also, for higher current levels, the device is further away from the sub-threshold conduction regime. By increasing the sense current levels, the Tc of the storage element decreases for all states. FIG. 5a also indicates that the C state has a higher Tc than that of the B state, and the B state has a higher Tc than that of the A state. To reduce the Tc of a storage element, we can sense the storage element at a relatively higher sense current. For example, to reduce the Tc of a C state storage element, we can sense the storage element at a relatively higher sense current. Since the E, A and B storage elements are locked out from sensing, this will have a negligible penalty on power consumption. Moreover, to achieve a relatively constant predetermined reference Tc, $T_{C-REF}$, we can use a specific different sense current when sensing each state. Specifically, reference currents $I_{SENSE-A}$, $I_{SENSE-B}$ and $I_{SENSE-C}$ as indicated can be used when performing sensing for the A, B or C state, respectively. Further, for a given state, the same sense currents can be used for both verify and reading, or different sense currents can be used for verify and reading.

In one option, a different reference current is provided for each state, and thus for each corresponding verify or read voltage. In another option, a different reference current is provided for at least two states, and thus for at least two corresponding verify or read voltages. In this case, a common reference current can be used for two or more states and corresponding verify or read voltages. For example, it may be determined that it is adequate to use the same reference current for the B and C states. Or, when there are eight states, E, A, B, C, D, E, F and G, it may be adequate to use a first reference current for the A, B and C states, a second reference current for the D and E states, and a third reference current for the F and G state. Testing of a particular memory device will indicate the performance which is achieved with different reference currents. Such testing can include measuring read errors and adjusting the number of different reference currents based on a tradeoff between minimizing read errors and minimizing overhead costs.

During programming, a storage element will continue to receive program pulses until its $V_{TH}$ is raised to a level at which the storage element enters a non-conductive state, and its sense current falls below $I_{SENSE-A}$, $I_{SENSE-B}$ or $I_{SENSE-C}$, for the A, B and C states, respectively, during a verify operation. As discussed in detail further below, the sensing can involve discharging a pre-charged capacitor into the storage element. The amount of discharge is correlated with a current level, which is compared to the desired reference levels $I_{SENSE-A}$, $I_{SENSE-B}$ or $I_{SENSE-C}$, which are programmed into the logic of the memory device and sensing components. Further, the discharge time period can be adjusted, also through logic of the memory device and sensing components, so that a specific voltage discharge level (trip point) and corresponding current level must be achieved in the specified discharge time period. A storage element is considered to be fully programmed to a given state only after it satisfies the imposed conditions which result in the sense current falling below the specified sense current level for the state.

Figure 5B:
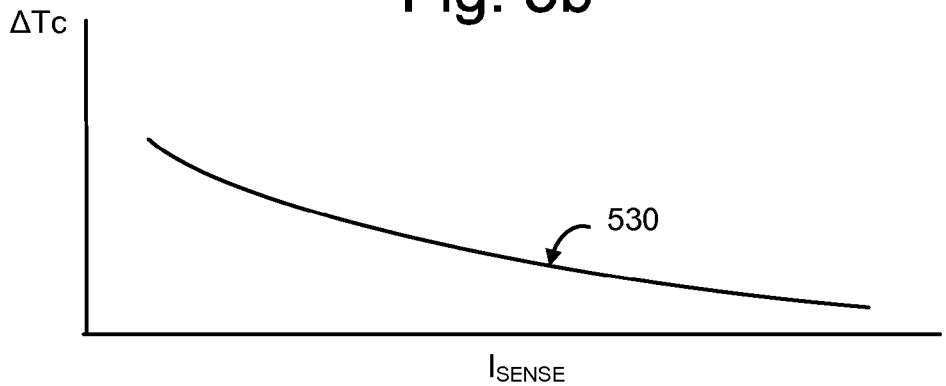
FIG. 5b depicts a change in temperature coefficient between high and low states versus sense current.

FIG. 5b depicts a change in temperature coefficient between high and low states versus sense current. For example, ΔTc may represent the difference between the C state Tc and the A state Tc. The magnitude of ΔTc decreases as the sense current increases. This is another advantage of sensing higher state storage elements at higher sense current levels than lower state storage elements. That is, by changing the sense current for the higher states, the state dependency of Tc can be reduced, resulting in tighter threshold distributions. For example, to reduce the difference in Tc between the A state and the C state by 50%, the sense current level can be increased by 50%. For a particular memory device, the optimal level of sense current for each state can be determined from testing.

Figure 5C:
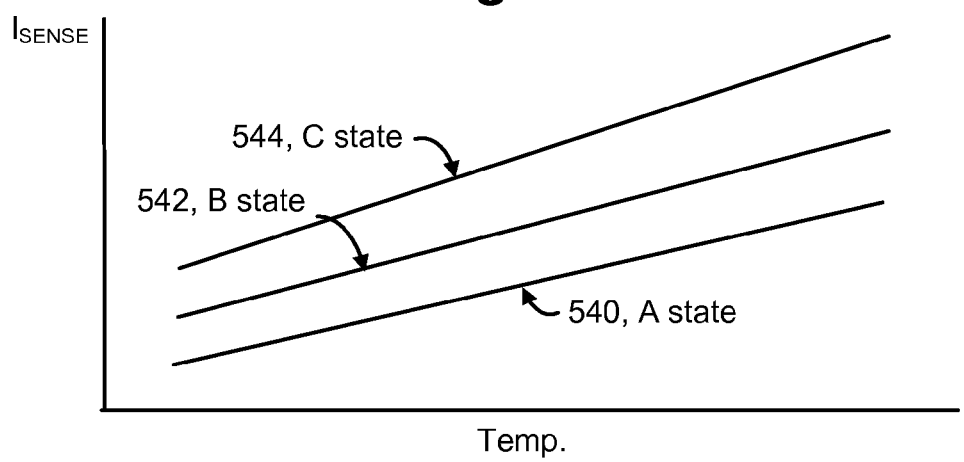
FIG. 5c depicts a change in sense current versus temperature for different states.

FIG. 5c depicts a change in sense current versus temperature for different states. Another approach to reducing temperature effects is to provide a temperature dependence on the sense current, such as decreasing $I_{SENSE}$ with reduced temperature. Curves 540, 542 and 544 depict a variation in the reference sense current versus temperature for states A, B and C, respectively. This approach can be applied separately or in combination with changing sense current based on data state. That is, different approaches include: changing $I_{SENSE}$ with data state, changing $I_{SENSE}$ with temperature, and changing $I_{SENSE}$ with data state and temperature. The latter approach provides a stronger reduction in the magnitude of Tc.

For example, assume a memory device is programmed to state C at a high temperature, $T_{HI}$. In this case, $I_{SENSE-C\ (T-HI)}$ is the reference sense current which corresponds with the reference $T_C$. That is, the sensing process can be configured so that the selected storage element will be programmed until the sensed current is at or below $I_{SENSE-C\ (T-HI)}$. A temperature dependent circuit, discussed further below, can be used to determine which $I_{SENSE}$ level to apply based on temperature, for each state. Moreover, different reference sense currents can be imposed by adjusting the discharge time of the capacitor. For example, for state C, one discharge time will correspond to imposing a reference sense current of $I_{SENSE-C\ (T-HI)}$ when the temperature is $T_{HI}$ and a longer discharge time will correspond to imposing a lower reference sense current of $I_{SENSE-C\ (T-LO)}$ when the temperature is $T_{LO}$. Intermediate discharge times can correspond to intermediate temperatures.

After programming, when the memory device is read back later, the appropriate reference sense current can be imposed based on the currently determined temperature. For example, if a storage element is programmed at a high temperature and read at a lower temperature, the $V_{TH}$ will have shifted higher. This shift can be compensated for by sensing the memory at a lower sense current. Thus, by reducing the $I_{SENSE}$ with decreasing temperature, Tc can be reduced for all states. Moreover, at any given temperature, the higher memory states will be sensed at a higher $I_{SENSE}$. It is also possible to treat the data states differently so that, for example, for the lower to middle states, e.g., states A and B, we change $I_{SENSE}$ with data state, and for the higher states, e.g., state C, we change $I_{SENSE}$ with data state and temperature. Typically, the same reference sense currents can be imposed during both program-verify and reading operations.

Generally, we can choose a Tc ($T_{C-REF}$) which is to be common for all of the states, and use the curves of FIG. 5a to locate the corresponding $I_{SENSE}$ for each state. The memory device can then be configured to use the selected $I_{SENSE}$ levels when sensing, as detailed further below.

With the approaches described herein, it is not necessary to use a temperature dependent word line voltage during reading. Further, it is not necessary to use reference cells as do some other approaches. While the Tc may not be entirely eliminated, providing a common Tc for all states will avoid the need for a state-based Tc, making the design simpler, and resulting in a tighter $V_{TH}$ distribution. Another option is to also adjust the word line voltage based on temperature to provide additional compensation. For example, a lower (since Vth is lower) word line voltage can be used for higher temperatures, and a higher word line voltage can be used for lower temperatures.

FIG. 6 depicts control gate read voltages applied to a selected word line during a read operation. During a read operation, a control gate voltage waveform having successive amplitudes $V_{CGR-A}$, $V_{CGR-B}$ and $V_{CGR-C}$ for states A, B and C, respectively, is applied to the word line of one or more selected storage elements which are being read in time periods t0-t1, t1-t2 and t2-t3, respectively. $V_{CGR-A}$, $V_{CGR-B}$ and $V_{CGR-C}$ are also depicted in FIG. 4. This example applies to the case where there are four available data states. Generally, the control gate voltage waveform will have $2^N-1$ amplitudes when there are $2^N$ possible data states.

FIG. 7 depicts an example pulse train applied to the control gates of selected non-volatile storage elements during programming. The pulse train 740 is used for programming and verifying storage elements. The pulse train 740 includes a number of program pulses 702, 704, 706, 708, 710 . . . and a set of verify pulses (one example of which is verify pulse set 742) between each pair of program pulses for verifying the storage elements. In one embodiment, the programming pulses have a voltage, $V_{PGM}$, which starts at 12 V and increases by increments, e.g., 0.5 V, for each successive programming pulse until a maximum of, e.g., 20-25 V is reached. In some embodiments, there can be a verify pulse for each state that data is being programmed into, e.g., state A, B and C. In other embodiments, there can be more or fewer verify pulses. The verify pulses in each set can have amplitudes of $V_{V-A}$, $V_{V-B}$ and $V_{V-C}$, for instance (also depicted in FIG. 4).

Figure 8:
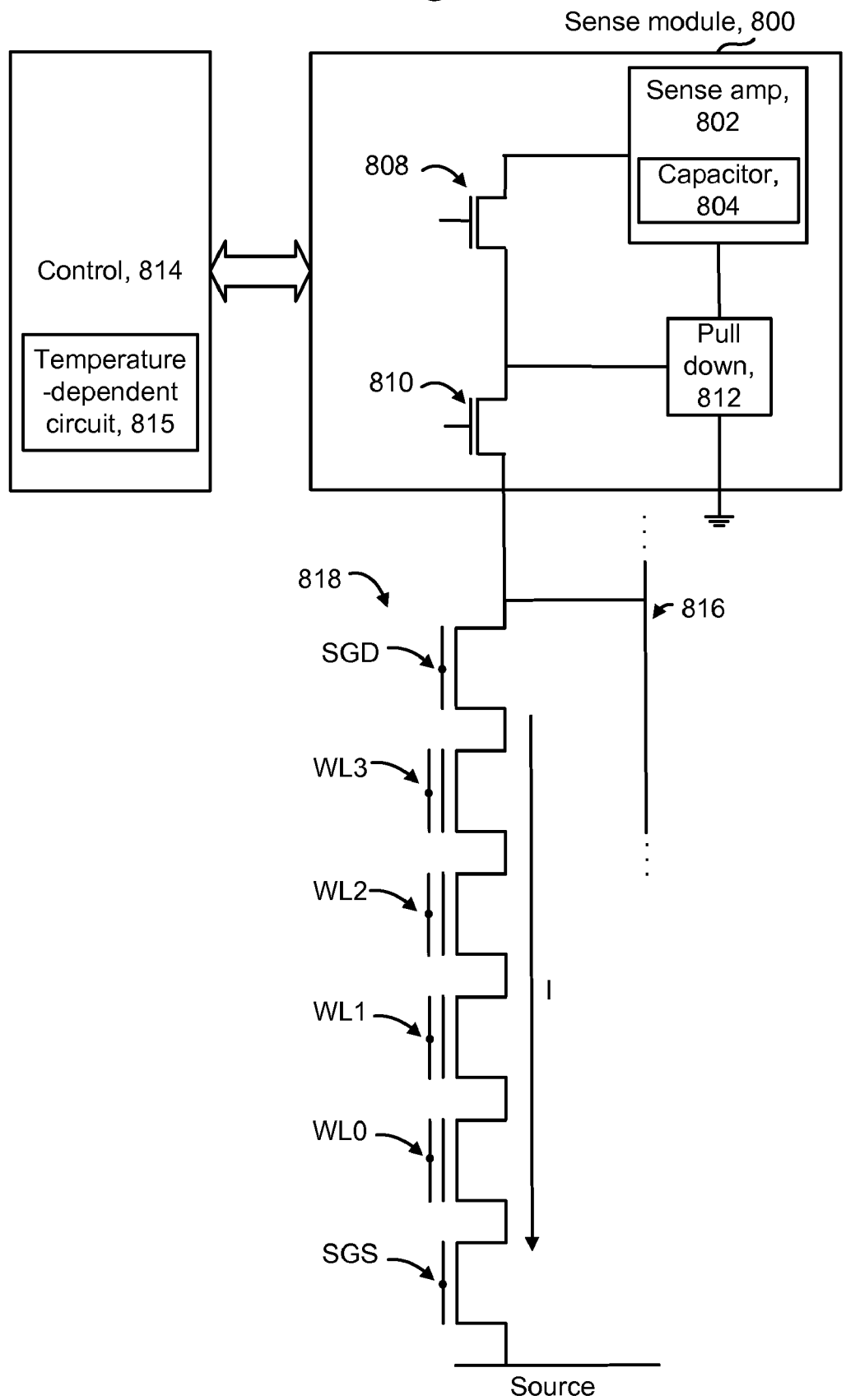
FIG. 8 depicts a configuration of a NAND string and components for sensing.

FIG. 8 depicts a configuration of a NAND string and components for sensing. In a simplified example, a NAND string 818 includes four storage elements which are in communication with word lines WL0, WL1, WL2 and WL3, respectively. In practice, additional storage elements and word lines can be used. Further, additional NAND strings are typically arranged adjacent to one another in a block or other set of non-volatile storage elements. The storage elements are coupled to a p-well region of a substrate. A bit line 816 communicates with a drain side of the NAND string and with a sense module 800. A bit line sense transistor 810 is coupled to the bit line 816. This is a high voltage transistor which is made conductive in response to a control 814 during sense operations to allow the sense module to communicate with the NAND string.

A bit line voltage clamp transistor 808 is a low voltage transistor which is opened in response to the control 814 to allow the bit line to communicate with a sense amplifier (amp) 802. During a sense operation, such as a read or verify operation, a pre-charge operation occurs in which a capacitor (charge-storing component) 804 in the sense amp 802 is charged. The transistor 808 may be opened to allow the pre-charging.

For example, assume the selected word line is WL1. During a sense operation, the voltage on WL1 is coupled to the control gates of the storage elements on WL1. For example, during a verify operation, after each program pulse the sequence of verify voltages $V_{V-A}$, $V_{V-B}$ and $V_{V-C}$ is provided on WL1. During a read operation, the sequence of read voltages $V_{CGR-A}$, $V_{CGR-B}$ and $V_{CGR-C}$ is provided on WL1. Further, a voltage $V_{SOURCE}$, typically at 0 V, is applied to the source side of the NAND string 818

Also during the sense operation, when the word line voltage is applied, the transistor 810 is turned on, e.g., made conductive, at the drain side of the NAND string 818. Additionally, a voltage is applied to the transistor 808 to make it conductive. When the selected storage element is in a conductive state, the pre-charged capacitor 804 discharges through the bit line and into the source, via the storage element and NAND string, so that the source acts as a current sink. A current "I" flows as indicated.

A pull down circuit 812 pulls the bit line to ground, Vsource or other level once sensing is completed for a storage element, so that the storage element is locked out from further sensing, even as sensing continues for other storage elements on other NAND strings.

The control 814 may also include a temperature-dependent circuit 815 for use with embodiments in which $I_{SENSE}$ is temperature dependent, such as discussed in connection with FIG. 5c. Various techniques are known for providing temperature-compensated signals generally. One or more of these techniques can be used in the temperature-dependent circuit 815, for instance. Most of these techniques do not rely on obtaining an actual temperature measurement, although this approach is also possible. For example, U.S. Pat. No. 6,801, 454, titled "Voltage Generation Circuitry Having Temperature Compensation," incorporated herein by reference, describes a voltage generation circuit which outputs read voltages to a non-volatile memory based on a temperature coefficient. The circuit uses a band gap current which includes a temperature-independent portion and a temperature-dependent portion which increases as temperature increases. U.S. Pat. No. 6,560,152, titled "Non-Volatile Memory With Temperature-Compensated Data Read", incorporated herein by reference, uses a bias generator circuit which biases a voltage which is applied to a source or drain of a data storage element. Any of the these techniques, as well as any other known techniques, can be used to provide a temperature-compensated sense current as described herein.

Figure 9A:
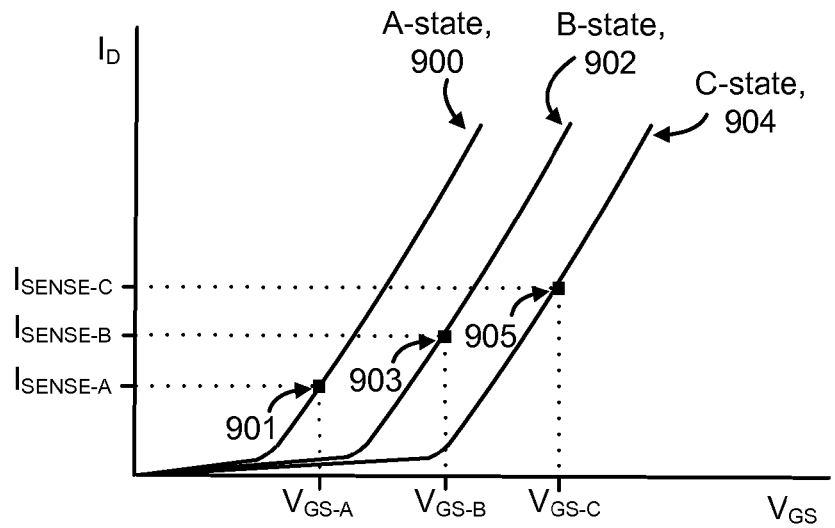
FIG. 9a depicts a current versus gate-to-source voltage relationship for a storage element for different states.

FIG. 9a depicts a current versus gate-to-source voltage relationship for a storage element for different states. The x-axis depicts the gate-to-source voltage of a storage element which is being sensed. For example, gate-to-source voltages of $V_{GS-A}$, $V_{GS-B}$ and $V_{GS-C}$ are indicated. During a verify operation, with Vsource=0 V, $V_{GS-A}$, $V_{GS-B}$ and $V_{GS-C}$ are the same as $V_{V-A}$, $V_{V-B}$ and $V_{V-C}$, respectively. During a read operation, with Vsource=0 V, $V_{GS-A}$, $V_{GS-B}$ and $V_{GS-C}$ are the same as $V_{CGR-A}$, $V_{CGR-B}$ and $V_{CGR-C}$, respectively. The y-axis depicts the drain current ID, which is the current passing through the storage element and the NAND string. This is also referred to as the sense current because it is the current which occurs during sensing. The reference sense current levels $I_{SENSE-A}$, $I_{SENSE-B}$ or $I_{SENSE-C}$, are also depicted. As mentioned, the sensing process can be configured so that, during program-verify, a storage element is not considered to be programmed to a given state until a current flows which falls below the reference sense current for that state. In contrast, during a read operation, a storage element is locked out from further sensing when a current flows which exceeds the reference sense current.

Curves 900, 902 and 904 depict the current to voltage relationship for storage elements in the A, B and C states, respectively. Generally, a current begins to flow from the drain to the source of a storage element when $V_{GS}$ begins to exceed the threshold voltage of the storage element. This level of $V_{GS}$ will vary for the different states since the threshold voltage varies for the different states. A weak current occurs for low values of $V_{GS}$ and the current increases for higher values of $V_{GS}$, at which point the storage element is considered to be in a conductive state. That is, the storage element is generally considered to be in a conductive state when it is at an operating point at which the curve has turned up sharply at a knee in the curve. Based on $V_{GS}$, a corresponding sense current will flow. For example, operating points 901, 903 and 905 may be identified at which the increasingly higher sense currents are $I_{SENSE-A}$, $I_{SENSE-B}$ and $I_{SENSE-C}$, respectively, in correspondence with FIG. 5a. The detected current must fall below these levels in order for a storage element to be fully programmed.

For example, during programming to the C state for instance, the current which flows during a verify operation will be large, initially, since $V_{V-A}$ (=$V_{GS}$)>$V_{TH}$ is large (since $V_{V-A}$ is fixed, $V_{SOURCE}$ is 0 V and $V_{TH}$ is initially small). As additional program pulses are applied, $V_{TH}$ will become larger so that $V_{GS}$-$V_{TH}$ becomes smaller and current also becomes smaller. Eventually, the current falls below the reference level, at which point the storage element is fully programmed.

Figure 9B:
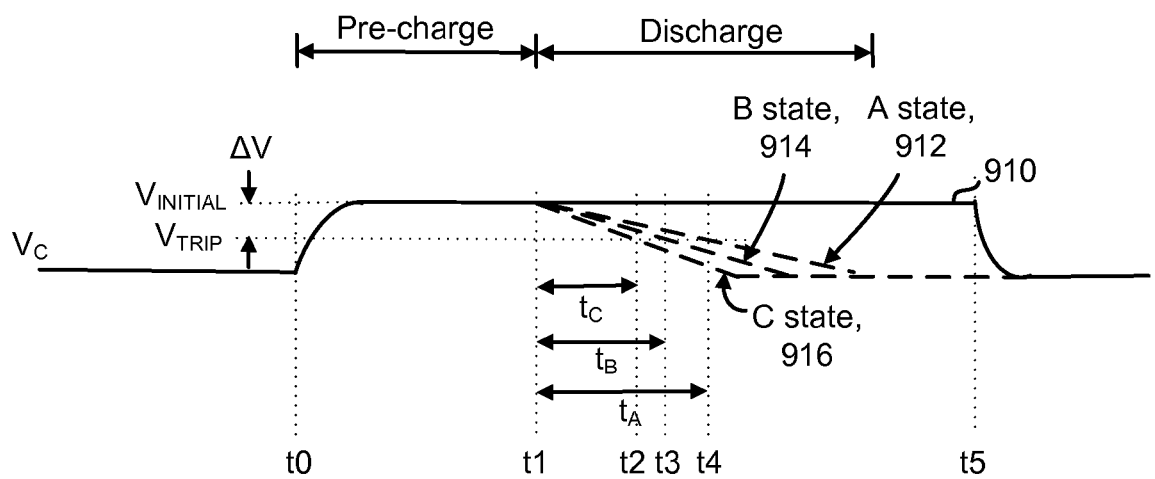
FIG. 9b depicts discharging of a voltage on a sense capacitor for different states.

FIG. 9b depicts discharging of a voltage on a sense capacitor for different states. During a sensing operation, the voltage on the capacitor 804 (FIG. 8) is pre-charged to an initial voltage $V_C$=$V_{INITIAL}$ in a pre-charge phase between t0 and t1. The pre-charging also brings the bit line voltage to a predetermined level which is appropriate for sensing. At a specified time t1, with the control gate voltage applied to the selected word line, a discharge phase begins in which the capacitor discharges into the selected storage element via the NAND string, and sinks to the source, if the selected storage element is in a conductive state. Further, the rate of discharge can vary depending on the state as indicated by lines 912, 914 and 916 for the A, B and C states, respectively. If the selected storage element is not in a conductive state, the capacitor will not significantly discharge, as indicated by line 910. By setting a sense time, also referred to as an integration time or discharge time, based on the data state, a corresponding sense current is induced. In particular, a sense time of $t_A=t4-t1$, $t_B=t3-t1$ or $t_C=t2-t1$ can be used for the A, B or C state, respectively. The sense time can also be adjusted based on temperature so that a longer discharge period (corresponding to a lower sense current) can be used with a lower temperature and a shorter discharge period (corresponding to a higher sense current) can be used with a higher temperature.

Moreover, with the appropriate sense time, the same voltage trip point $V_{TRIP}$ can be used for each state. $V_{TRIP}$ represents a level such that if $V_C$ falls below $V_{TRIP}$ at the sense time, the selected storage elements is deemed to be in a conductive state, and if $V_C$ does not fall below $V_{TRIP}$ at the sense time, the selected storage element is deemed to be in a non-conductive state. Further, the sense current is related to the discharging of the capacitance by $I_{SENSE}=(\Delta V/t) \times C$, where C is the capacitance of the capacitor 804. Thus, for the A, B or C state, $I_{SENSE-A}=(\Delta V/t_A) \times C$, $I_{SENSE-B}=(\Delta V/t_B) \times C$ and $I_{SENSE-C}=(\Delta V/t_C) \times C$, respectively. In other words, during programming, a storage element will continue to receive program pulses until its $V_{TH}$ is raised to a level at which its gate-to-source voltage is sufficiently low to result in its sense current falling below $I_{SENSE-A}$, $I_{SENSE-B}$ or $I_{SENSE-C}$, for the A, B and C states, respectively, during a verify operation. The capacitor of the sense amp may therefore be considered to be a current source which provides a certain current if the selected storage element is in a conductive state. $V_C$ is discharged at t5.

Thus, an increase in sense current level can be achieved by reducing the integration time during the sensing operation for any memory state. For the same trip point, a decrease in integration time will imply a corresponding increase in the sense current level. This feature can be easily implemented in existing memory designs which allow varying the integration time. The approach allows changing the Tc more for higher states and less for lower states, ideally converging to a single Tc for all the states. For example, assume a given memory device is configured with a capacitance C and a $\Delta V$ based on a difference between $V_{INITIAL}$ and $V_{TRIP}$. For the A state, for instance, with a selected predetermined $I_{SENSE-A}$ based on, e.g., FIG. 5a, the appropriate sense time $t_A$ can be determined from the relation: $t_A=\Delta V/(I_{SENSE-A} \times C)$. Similarly, the sense times for the B and C states, respectively, are $t_B=\Delta V/(I_{SENSE-B} \times C)$ and $t_C=\Delta V/(I_{SENSE-C} \times C)$. $\Delta V$, C and sense current are known design parameters from which sense time is determined accordingly. As mentioned, the sense time can change with temperature also to provide a different Isense at a different Temp. according to FIG. 5c)

Various approaches may be used which induce a sense current in a selected storage elements based on data state. For example, one current source circuit may be used which is adjustable to provide different sense current outputs, or a number of different current source circuits, one for each sense current output, may be used.

Further details regarding sensing can be found in U.S. Pat. No. 7,376,030, incorporated herein by reference.

FIG. 10a depicts a program and verify process. A program operation begins at step 1000. At step 1002, a program pulses is applied to a selected word line. At step 1004, a verify operation begins. Step 1006 includes applying a control gate verify voltage $V_{V-A}$ to the selected word line, and step 1008 includes sensing the current and comparing it to $I_{SENSE-A}$ to determine whether the selected storage elements are in a conductive state. Next, step 1010 includes applying a control gate verify voltage $V_{V-B}$ to the selected word line, and step 1012 includes sensing the current and comparing it to $I_{SENSE-B}$ to determine whether the selected storage elements are in a conductive state. Next, step 1014 includes applying a control gate verify voltage $V_{V-C}$ to the selected word line, and step 1016 includes sensing the current and comparing it to $I_{SENSE-C}$ to determine whether the selected storage elements are in a conductive state. If there is a next program pulse at decision step 1018, processing continues at step 1002. Otherwise, the program operation ends at step 1019. This process can be extended accordingly when there are more than four data states.

FIG. 10b depicts a read process. A read operation begins at step 1020. At step 1022, a control gate read voltage $V_{CGR-A}$ is applied to the selected word line, and step 1024 includes sensing the current and comparing it to $I_{SENSE-A}$ to determine whether a selected storage elements are in a conductive state. At step 1026, a control gate read voltage $V_{CGR-B}$ is applied to the selected word line, and step 1028 includes sensing the current and comparing it to $I_{SENSE-B}$ to determine whether the selected storage elements are in a conductive state. At step 1030, a control gate read voltage $V_{CGR-C}$ is applied to the selected word line, and step 1032 includes sensing the current and comparing it to $I_{SENSE-C}$ to determine whether the selected storage elements are in a conductive state. The read operation ends at step 1034.

For a given storage element, the data state is determined based on the first control gate voltage which causes the storage element to become conductive, assuming the control gate voltages are applied from low to high. For instance, if $V_{CGR-A}$ is the first voltage which causes a storage element to become conductive, the storage element is in the E state. If $V_{CGR-B}$ is the first voltage which causes a storage element to become conductive, the storage element is in the A state. If $V_{CGR-C}$ is the first voltage which causes a storage element to become conductive, the storage element is in the B state. If none of the control gate voltages cause a storage element to become conductive, the storage element is in the C state. A given storage element which is determined to be in particular state is locked out from further reading. In this example, for a given state, the same sense current is used for verify and read operations.

Figure 11:
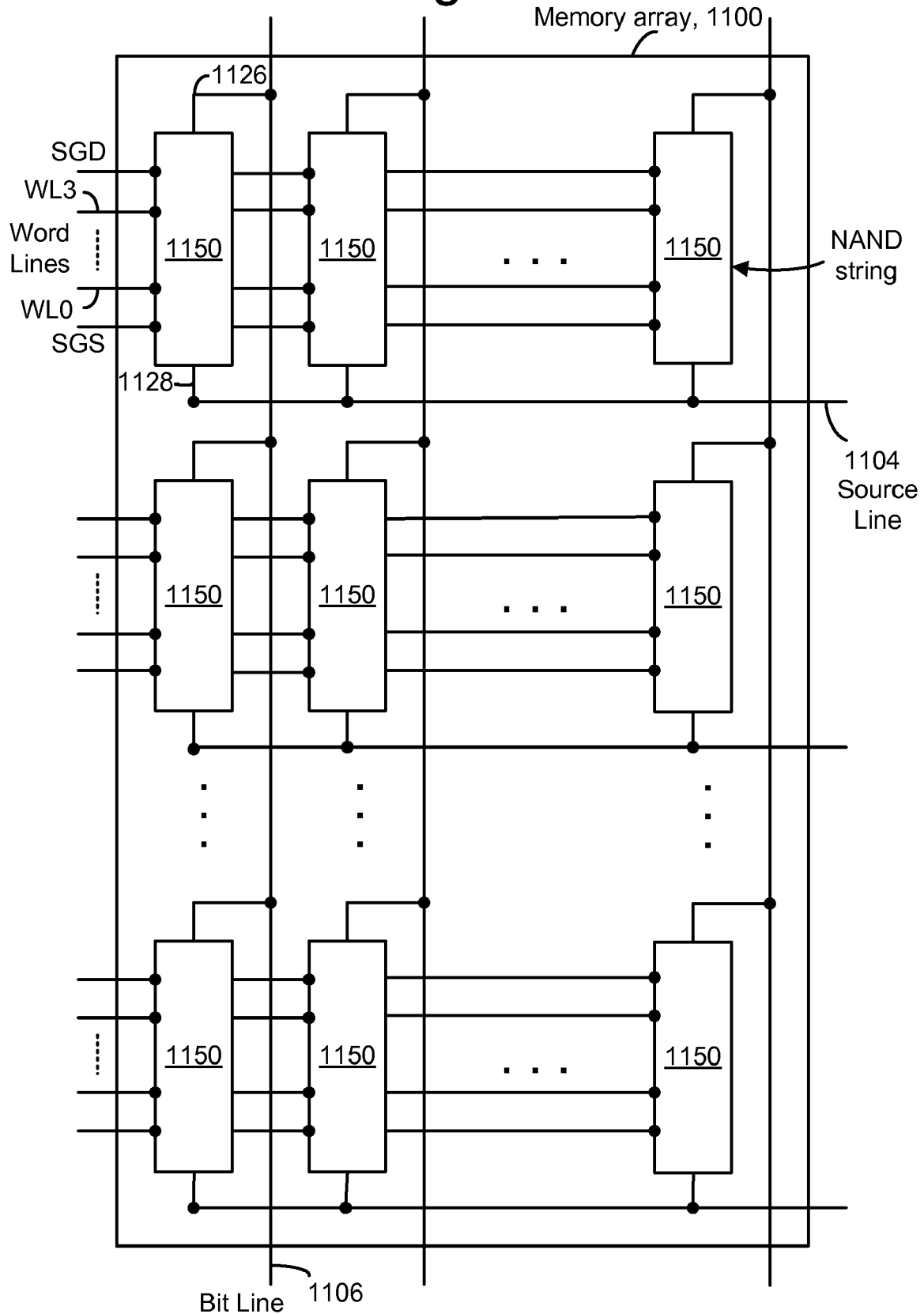
FIG. 11 is a block diagram of an array of NAND flash storage elements.

FIG. 11 illustrates an example of an array 1100 of NAND storage elements, such as those shown in FIGS. 1 and 2. Along each column, a bit line 1106 is coupled to the drain terminal 1126 of the drain select gate for the NAND string 1150. Along each row of NAND strings, a source line 1104 may connect all the source terminals 1128 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 12:
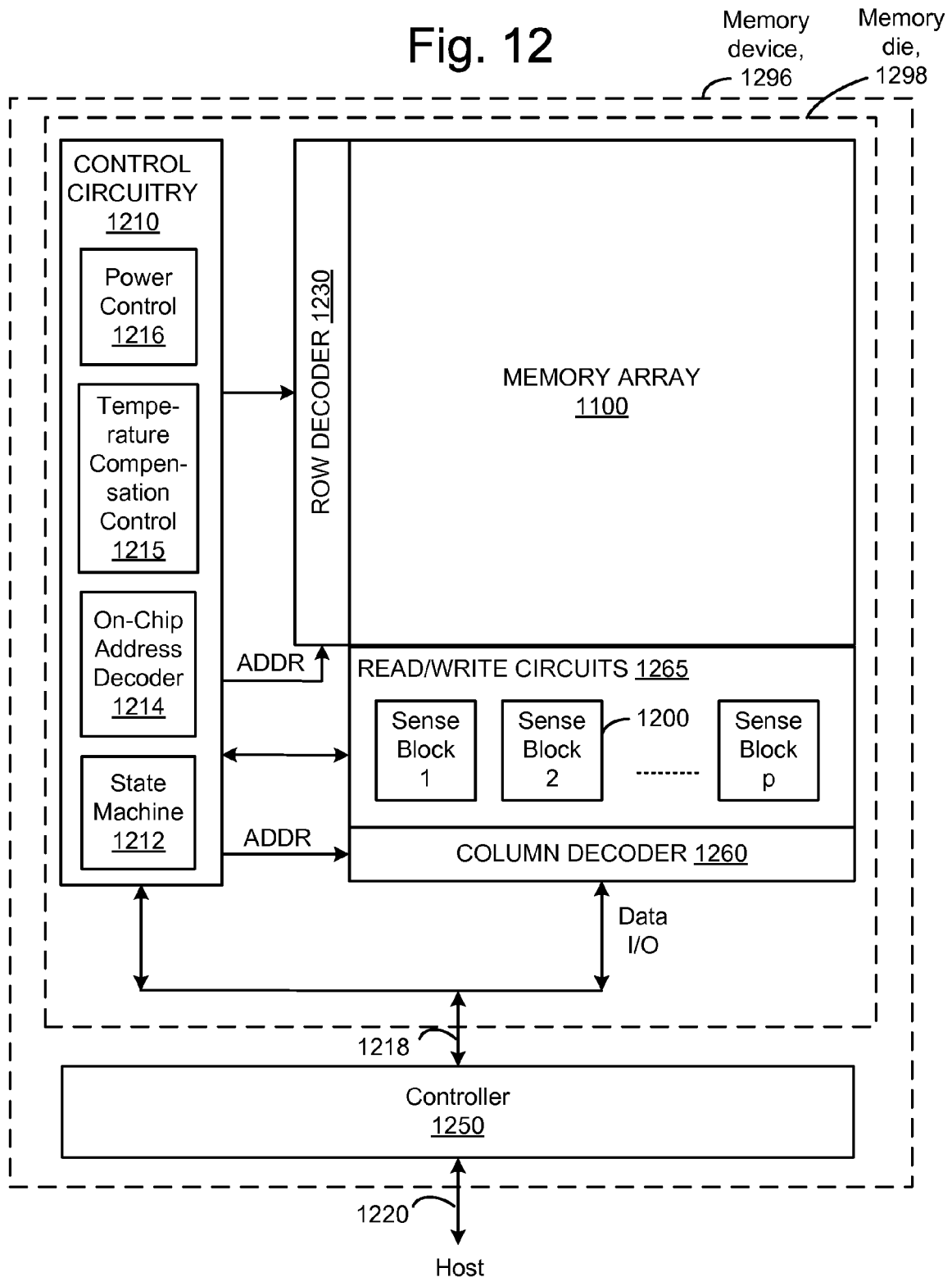
FIG. 12 is a block diagram of a non-volatile memory system using single row/column decoders and read/write circuits.

FIG. 12 is a block diagram of a non-volatile memory system using single row/column decoders and read/write circuits. The diagram illustrates a memory device 1296 having read/write circuits for reading and programming a page of storage elements in parallel, according to one embodiment of the present invention. Memory device 1296 may include one or more memory die 1298. Memory die 1298 includes a two-dimensional array of storage elements 1100, control circuitry 1210, and read/write circuits 1265. In some embodiments, the array of storage elements can be three dimensional. The memory array 1100 is addressable by word lines via a row decoder 1230 and by bit lines via a column decoder 1260. The read/write circuits 1265 include multiple sense blocks 1200 and allow a page of storage elements to be read or programmed in parallel. Typically a controller 1250 is included in the same memory device 1296 (e.g., a removable storage card) as the one or more memory die 1298. Commands and Data are transferred between the host and controller 1250 via lines 1220 and between the controller and the one or more memory die 1298 via lines 1218.

The control circuitry 1210 cooperates with the read/write circuits 1265 to perform memory operations on the memory array 11100. The control circuitry 1210 includes a state machine 1212, an on-chip address decoder 1214, temperature compensation control 1215 and a power control module 1216. The state machine 1212 provides chip-level control of memory operations, and may include an ECC decoding engine. The on-chip address decoder 1214 provides an address interface between that used by the host or a memory controller to the hardware address used by the decoders 1230 and 1260. The temperature compensation control 1215 can provide a temperature dependent sense current as discussed herein (see, e.g., FIG. 5c). The power control module 1216 controls the power and voltages supplied to the word lines and bit lines during memory operations.

In some implementations, some of the components of FIG. 12 can be combined. In various designs, one or more of the components (alone or in combination), other than storage element array 1100, can be thought of as a managing circuit. For example, one or more managing circuits may include any one of or a combination of control circuitry 1210, state machine 1212, decoders 1214/1260, power control 1216, sense blocks 1200, read/write circuits 1265, controller 1250, and so forth.

In another approach, access to the memory array 1100 by the various peripheral circuits is implemented in a symmetric fashion, on opposite sides of the array, so that the densities of access lines and circuitry on each side are reduced by half. Thus, the row decoder is split into two row decoders and the column decoder is split into two column decoders. Similarly, the read/write circuits are split into read/write circuits connecting to bit lines from the bottom of the array 1100 and read/write circuits connecting to bit lines from the top of the array 1100. In this way, the density of the read/write modules is essentially reduced by one half.

Figure 13:
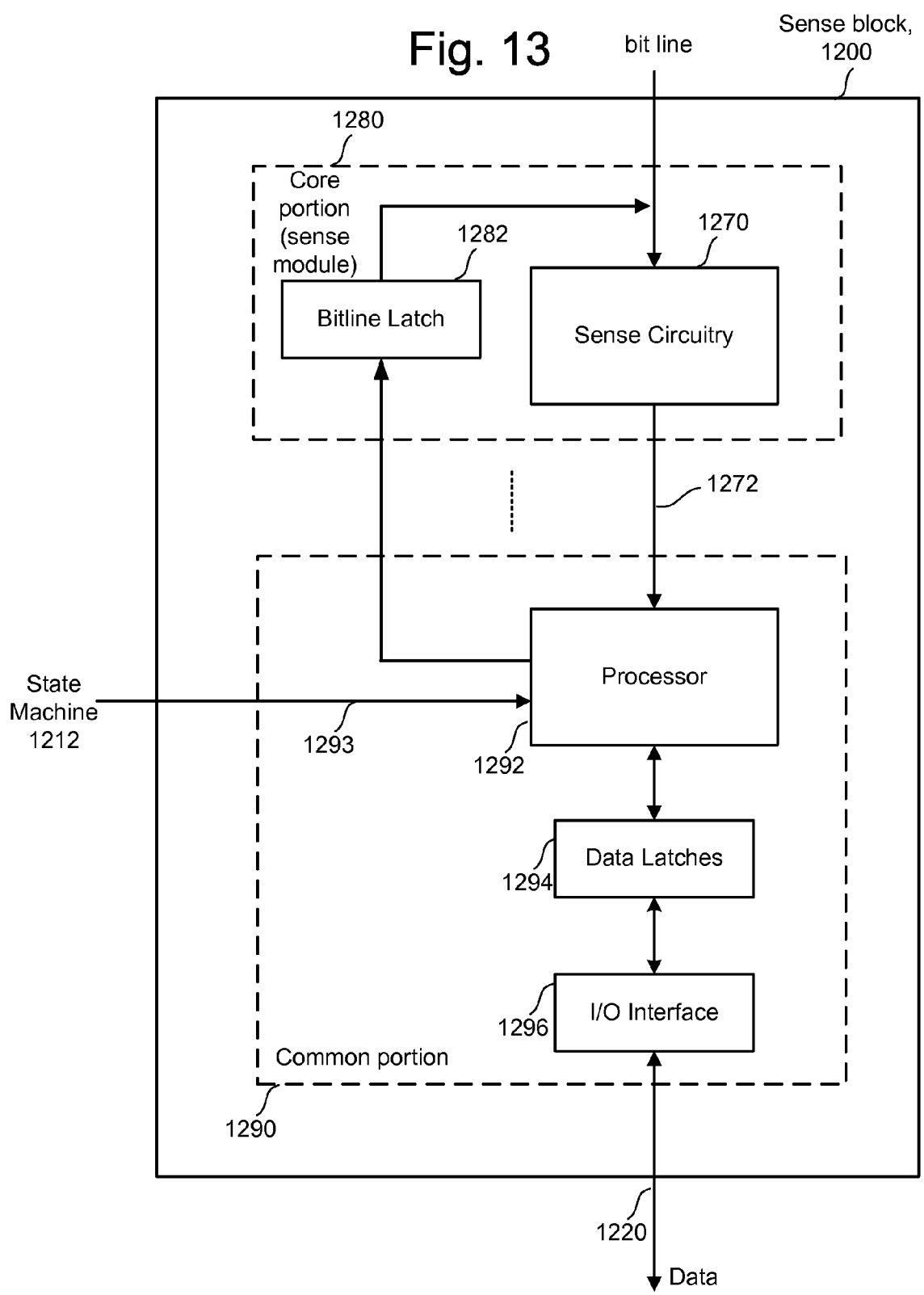
FIG. 13 is a block diagram depicting one embodiment of a sense block.

FIG. 13 is a block diagram depicting one embodiment of a sense block. An individual sense block 1200 is partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details refer to U.S. Patent Application Pub No. 2006/0140007, titled "Non-Volatile Memory and Method with Shared Processing for an Aggregate of Sense Amplifiers" published Jun. 29, 2006, and incorporated herein by reference in its entirety.

Sense module 1280 comprises sense circuitry 1270 that determines whether a conduction current in a connected bit line is above or below a predetermined threshold level. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., 1.5-3 V).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed storage element and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1212 that controls the supply of different control gate voltages to the addressed storage element. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1292 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1294 from the data bus 1220. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1292 monitors the read back memory state relative to the desired memory state. When the two are in agreement, the processor 1292 sets the bit line latch 1282 so as to cause the bit line to be pulled to a state designating program inhibit. This inhibits the storage element coupled to the bit line from further programming even if programming pulses appear on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are three data latches per sense module 1280. In some implementations (but not required), the data latches are implemented as a shift register so that the parallel data stored therein is converted to serial data for data bus 1220, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the structure and/or operations of various embodiments of non-volatile storage devices can be found in U.S. Pat. Nos. 7,196,931, 7,023,736, 7,046,568, 7,196,928 and 7,327,619, each of which is incorporated herein by reference.

Figure 14:
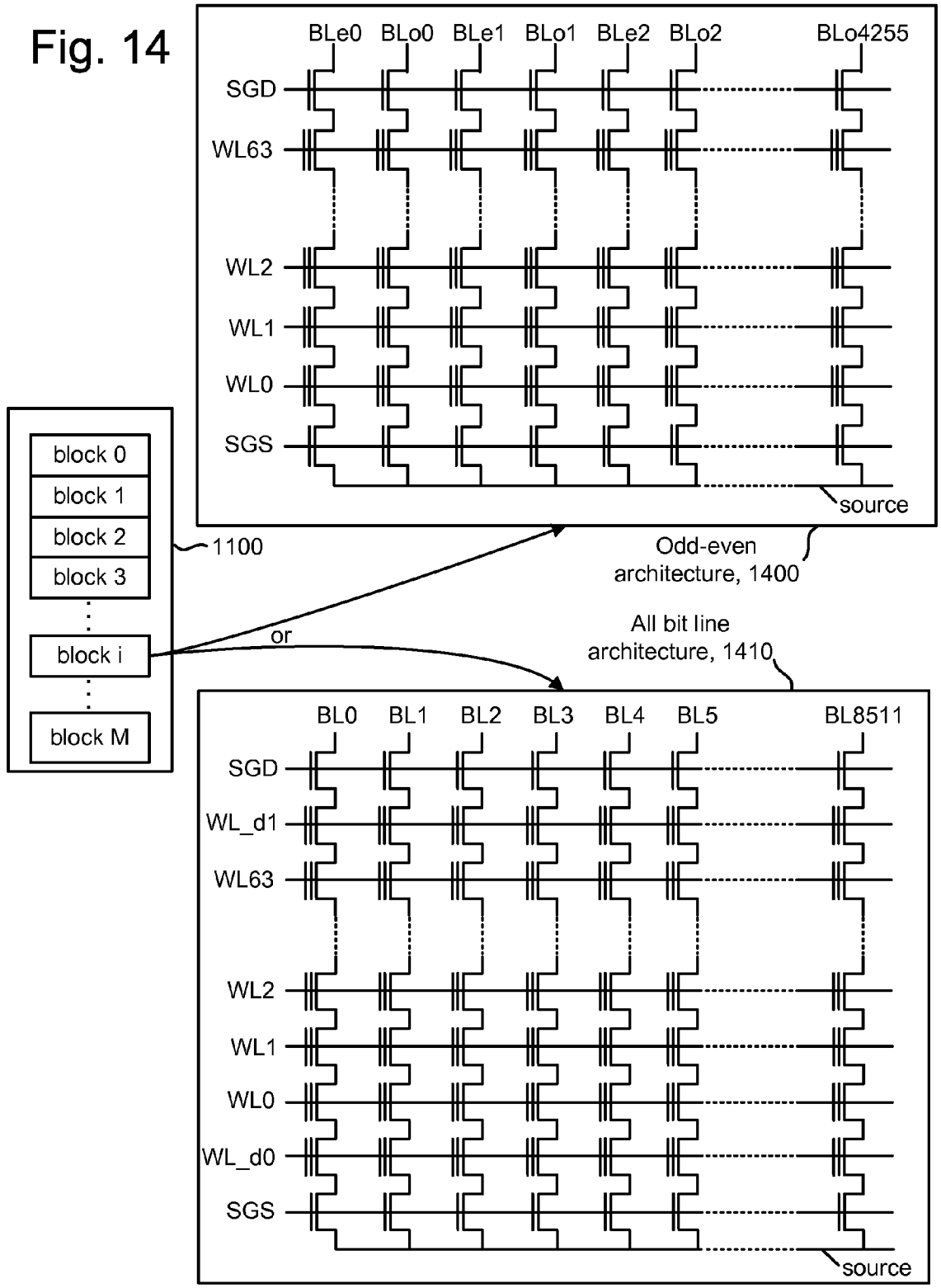
FIG. 14 illustrates an example of an organization of a memory array into blocks for an all bit line memory architecture or for an odd-even memory architecture.

FIG. 14 illustrates an example of an organization of a memory array into blocks for an all bit line memory architecture or for an odd-even memory architecture. Exemplary structures of memory array 1100 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1410), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 1400), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 15:
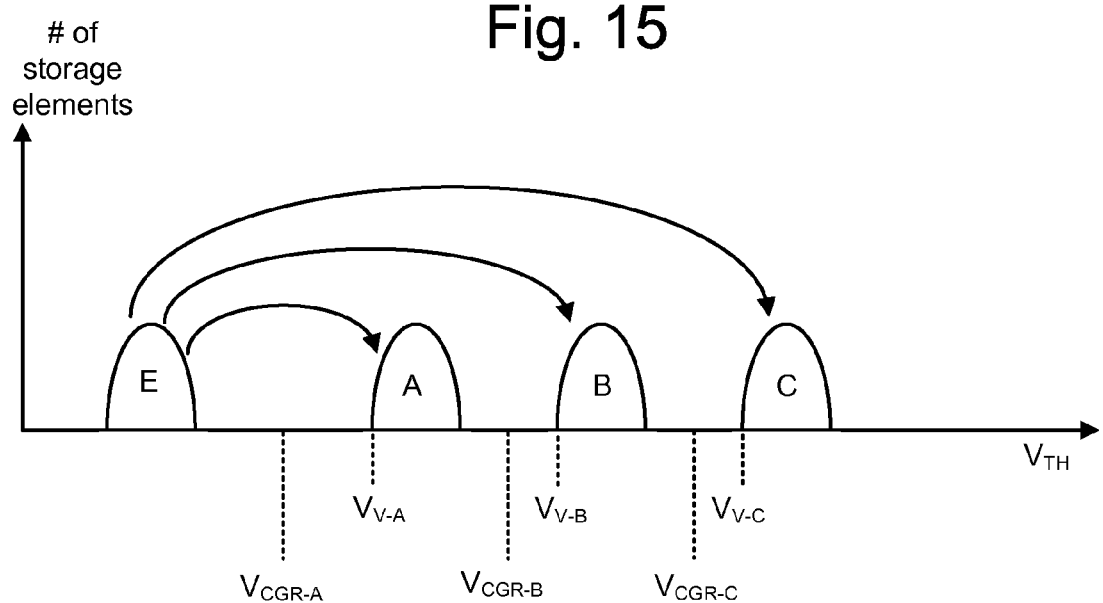
FIG. 15 depicts an example set of threshold voltage distributions and one-pass programming.

FIG. 15 depicts an example set of threshold voltage distributions and one-pass programming. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Pat. No. 7,237,074, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, $V_{CGR-A}$, $V_{CGR-B}$ and $V_{CGR-C}$, are also provided for reading data from storage elements. By testing whether the threshold voltage of a given storage element is above or below $V_{CGR-A}$, $V_{CGR-B}$ and $V_{CGR-C}$, the system can determine the state, e.g., programming condition, the storage element is in.

Further, three verify reference voltages, $V_{V-A}$, $V_{V-B}$ and $V_{V-C}$, are provided. When programming storage elements to state A, the system will test whether those storage elements have a threshold voltage greater than or equal to $V_{V-A}$. When programming storage elements to state B, the system will test whether the storage elements have threshold voltages greater than or equal to $V_{V-B}$. When programming storage elements to state C, the system will determine whether storage elements have their threshold voltage greater than or equal to $V_{V-C}$.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn–1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Figure 16:
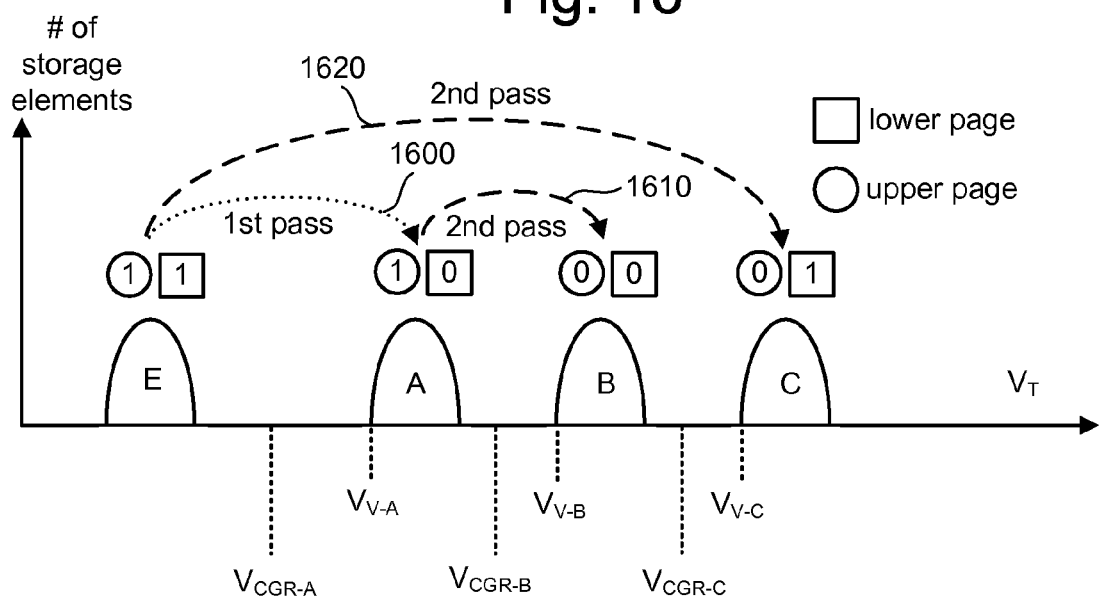
FIG. 16 depicts an example set of threshold voltage distributions and two-pass programming.

FIG. 16 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1600. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 1620. If the storage element had been programmed into state A as a result of the first programming pass, then the storage element is further programmed in the second pass so that the threshold voltage is increased to be within state B, as depicted by arrow 1610. The result of the second pass is to program the storage element into the state designated to store a logic "0" for the upper page without changing the data for the lower page. In both FIG. 15 and FIG. 16, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Pat. No. 7,120,051, incorporated herein by reference.

Figure 17A:
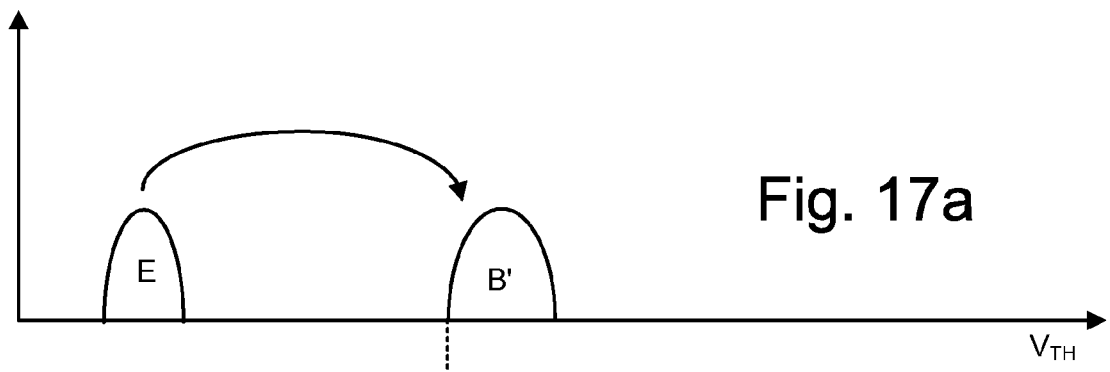
FIGS. 17a-c show various threshold voltage distributions and describe a process for programming non-volatile memory.
Figure 17B:
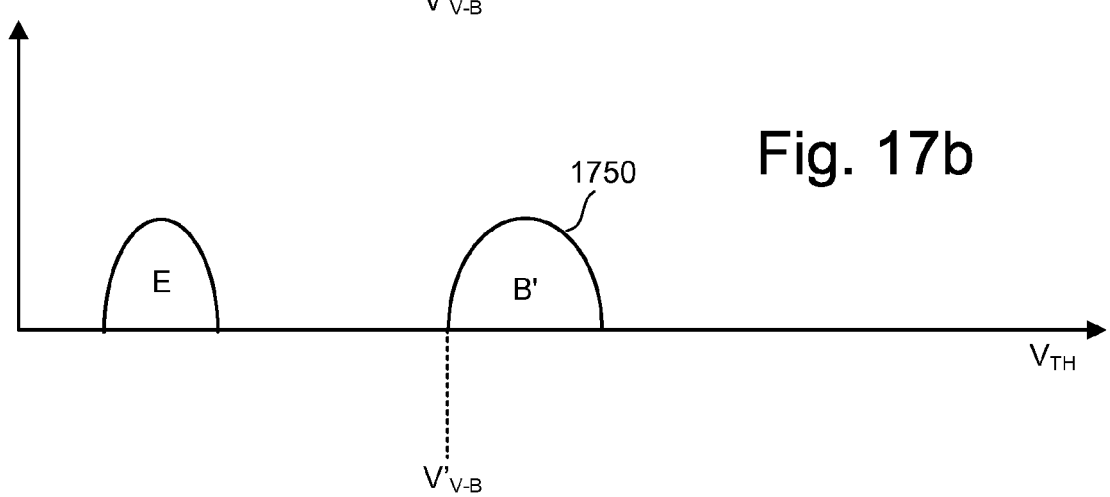
Figure 17C:
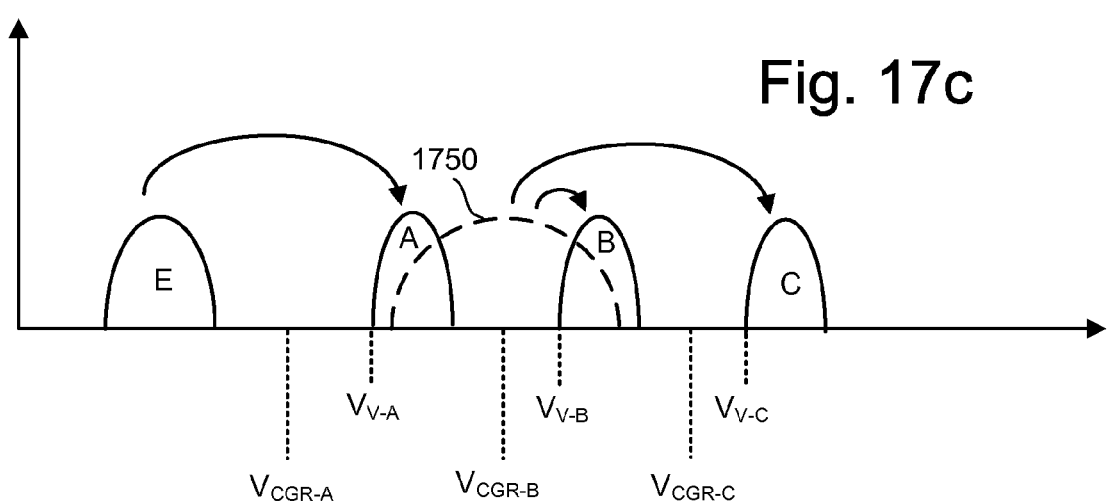

FIGS. 17a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 17a therefore shows the programming of storage elements from state E to state B'. State B' is an interim state B; therefore, the verify point is depicted as $V'_{V-B}$, which is lower than $V_{V-B}$.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1750 of FIG. 17b. This apparent widening of the threshold voltage distribution will be remedied when programming the upper page.

FIG. 17c depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 1750 and the upper page data is to remain at 1, then the storage element will be programmed to final state B. If the storage element is in intermediate threshold voltage distribution 1750 and the upper page data is to become data 0, then the threshold voltage of the storage element will be raised so that the storage element is in state C. The process depicted by FIGS. 17a-c reduces the effect of floating gate to floating gate coupling because only the upper page programming of neighbor storage elements will have an effect on the apparent threshold voltage of a given storage element. An example of an alternate state coding is to move from distribution 1750 to state C when the upper page data is a 1, and to move to state B when the upper page data is a 0. Although FIGS. 17a-c provide an example with respect to four data states and two pages of data, the concepts taught can be applied to other implementations with more or fewer than four states and more or less than two pages.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
   applying a plurality of voltages, one at a time, to a control gate of a selected non-volatile storage element; and while applying each voltage, coupling, to the selected non-volatile storage element, at least one current source;
   sensing a current which flows through the selected non-volatile storage element; and
   comparing the sensed current to a reference current which is different for at least two of the voltages, wherein the reference current is set according to different temperature coefficient versus current relationships of different data states.

2. The method of claim 1, wherein:
   the reference current is higher for higher voltages.

3. The method of claim 1, wherein:
   the selected non-volatile storage element is series-connected to other non-volatile storage elements in a string, and the at least one current source is coupled to a drain end of the string.

4. The method of claim 3, wherein:
   the string comprises a NAND string, and the at least one current source is coupled to a bit line of the NAND string.

5. The method of claim 1, wherein:
   the reference current is different for each voltage.

6. The method of claim 1, wherein:
   the reference current is the same for at least two voltages.

7. The method of claim 1, wherein:
   the at least one current source comprises a charge-storing component, and the sensing comprises determining an extent to which the charge-storing component discharges.

8. The method of claim 1, wherein:
   the plurality of voltages are applied in a read or verify operation.

9. The method of claim 1, wherein:
   the reference current for at least one of the voltages is temperature dependent.

10. The method of claim 1, wherein:
    at least one of the voltages is temperature compensated.

11. A method for operating non-volatile storage, comprising:
    applying a voltage to a control gate of at least one selected non-volatile storage element in a NAND string via a selected word line, the voltage separates lower and higher states;
    if the at least one selected non-volatile storage element is made conductive by the applying the voltage, inducing a current through the selected non-volatile storage element; and comparing the current to a reference current which is based on a reference temperature coefficient of the higher state.

12. The method of claim 11, wherein:
the voltage is applied in a verify operation.

13. The method of claim 11, wherein:
the level of the reference current is temperature-dependent.

14. A method for operating non-volatile storage, comprising:
applying a plurality of voltages, one at a time, to a control gate of a selected non-volatile storage element;
while applying each voltage, coupling, to the selected non-volatile storage element, a pre-charged capacitor, the capacitor discharges into the selected non-volatile storage element when the selected non-volatile storage element is in a conductive state; and
after a discharge time which differs for each of the voltages, determining whether the selected non-volatile storage element is in the conductive state based on whether the capacitor has discharged below a trip point.

15. The method of claim 14, wherein:
the trip point is the same for each of the voltages.

16. The method of claim 14, wherein:
when the selected non-volatile storage element is in the conductive state, the capacitor discharges into the selected non-volatile storage element resulting in a current through the selected non-volatile storage element, a level of the current differs for each of the voltages.

17. The method of claim 14, wherein:
the determining whether the capacitor has discharged below the trip point comprises comparing the current to a reference current which differs for each voltage.

18. The method of claim 14, wherein:
the discharge time for at least one of the voltages is temperature dependent.

19. A non-volatile storage system, comprising:
a set of non-volatile storage elements including a selected non-volatile storage element having a control gate;
at least one current source; and
at least one control circuit, the at least one control circuit applies voltages, one at a time, to the control gate of the selected non-volatile storage element of the set, while applying each voltage, couples, to the selected non-volatile storage element, the at least one current source, senses a current which flows through the selected non-volatile storage element, and compares the sensed current to a reference current which is different for at least two of the voltages, wherein the reference current is set according to different temperature coefficient versus current relationships of different data states.

* * * * *